(12) United States Patent
Msryan et al.

(10) Patent No.: US 12,211,578 B2
(45) Date of Patent: Jan. 28, 2025

(54) DDR PHY POWER COLLAPSE CIRCUIT FOR MULTIMODE DOUBLE DATA RATE SYNCHRONOUS DYNAMIC RANDOM ACCESS MEMORY

(71) Applicant: QUALCOMM Incorporated, San Diego, CA (US)

(72) Inventors: Levon Msryan, Cork (IE); Tigran Melikyan, Cork (IE); Ashwin Sethuram, San Clemente, CA (US); Satish Krishnamoorthy, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 168 days.

(21) Appl. No.: 17/973,996

(22) Filed: Oct. 26, 2022

(65) Prior Publication Data

US 2024/0144980 A1 May 2, 2024

(51) Int. Cl.
*G11C 5/14* (2006.01)
*H03K 19/094* (2006.01)

(52) U.S. Cl.
CPC ............. *G11C 5/148* (2013.01); *G11C 5/145* (2013.01); *G11C 5/147* (2013.01); *H03K 19/09429* (2013.01)

(58) Field of Classification Search
CPC .......... G11C 5/148; G11C 5/145; G11C 5/147; H03K 19/09429
See application file for complete search history.

(56) References Cited

U.S. PATENT DOCUMENTS

| | | | |
|---|---|---|---|
| 9,997,214 B1* | 6/2018 | Kumar | G11C 7/1069 |
| 2019/0305778 A1* | 10/2019 | Chen | H03K 17/6872 |
| 2022/0038095 A1* | 2/2022 | Hafizi | G05F 1/575 |

OTHER PUBLICATIONS

International Search Report and Written Opinion—PCT/US2023/072845—ISA/EPO—Nov. 22, 2023

* cited by examiner

*Primary Examiner* — Min Huang
(74) *Attorney, Agent, or Firm* — Loza & Loza, LLP (57) ABSTRACT

A transmitter circuit includes a first driver circuit configured to drive an input/output pad in an integrated circuit device, the first driver circuit including a thin-oxide transistor configured to couple the input/output pad to a first voltage rail when the transmitter circuit is operated in a first mode; a gate pullup transistor configured to couple a gate of the thin-oxide transistor to a second voltage rail when voltage of a third voltage rail is collapsed to a zero-volt level; and a switch configured to block transmission of a gating signal to the gate of the thin-oxide transistor when the voltage of the third voltage rail is collapsed to the zero-volt level.

24 Claims, 7 Drawing Sheets

DDR PHY POWER COLLAPSE CIRCUIT FOR MULTIMODE DOUBLE DATA RATE SYNCHRONOUS DYNAMIC RANDOM ACCESS MEMORY

TECHNICAL FIELD

The present disclosure generally relates to interface circuits for integrated circuits and, more particularly, to driver circuits that can operate in combination transmitters that support multiple voltage levels and signaling schemes for memory devices.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Continuous service enhancements require the advancement of process technologies that can provide integrated circuit (IC) devices with ever increasing performance and transistor densities.

IC devices may include memory interfaces with physical layer circuits that are configured to read and write double data rate random access memory devices. Increased demands for memory interfaces that support higher data rates have been among the drivers that led and continue to lead to advancements in process technologies. Changes in certain aspects of large-scale IC designs and semiconductor manufacturing processes, including reductions in process minimum feature size can create new or different susceptibilities of IC devices to electrical overstress (EOS). For example, reductions in transistor gate length, and transistor gate oxide thickness and other features can limit the voltage levels that can be sustained or tolerated by transistors. Transmitter circuits in memory devices may need to support different memory standards that specify different voltage ranges and signaling schemes, which can compromise the integrity of transistor in low-voltage circuits.

Accordingly, there is an ongoing need for improvements in transmitter circuits that protect transistors, including thin-oxide transistors, from EOS.

SUMMARY

Certain aspects of the disclosure relate to systems, apparatus, methods and techniques that can avoid electrical overstress that can affect transistors in memory device input/output circuits. Some examples disclosed herein are applicable to the protection of circuits that operate in modes that support different voltage domains.

In one aspect of the disclosure, a transmitter circuit includes a first driver circuit configured to drive an input/output pad in an integrated circuit device, the first driver circuit including a thin-oxide transistor configured to couple the input/output pad to a first voltage rail when the transmitter circuit is operated in a first mode; a gate pullup transistor configured to couple a gate of the thin-oxide transistor to a second voltage rail when voltage of a third voltage rail is collapsed to a zero-volt level; and a switch configured to block transmission of a gating signal to the gate of the thin-oxide transistor when the voltage of the third voltage rail is collapsed to the zero-volt level.

In one aspect of the disclosure, an apparatus has means for driving an input/output pad provided in an integrated circuit device, including a thin-oxide transistor in a first driver circuit that is active when the apparatus is operated in a first mode and that is configured to couple the input/output pad to the first voltage rail when active; means for pulling a gate of the thin-oxide transistor to a second voltage rail when voltage of a third voltage rail is collapsed to a zero-volt level; and means for blocking transmission of a gating signal to the gate of the thin-oxide transistor when the voltage of the third voltage rail is collapsed to the zero-volt level.

In one aspect of the disclosure, a method for operating a transmitter circuit includes configuring a first driver circuit to drive an input/output pad in an integrated circuit device when the transmitter circuit is operated in a first mode, the first driver circuit including a thin-oxide transistor configured to couple the input/output pad to a first voltage rail when the transmitter circuit is operated in a first mode; configuring a gate pullup transistor to couple a gate of the thin-oxide transistor to a second voltage rail when voltage of a third voltage rail is collapsed to a zero-volt level; and configuring a switch to block transmission of a gating signal to the gate of the thin-oxide transistor when the voltage of the third voltage rail is collapsed to the zero-volt level.

In certain examples, the transmitter circuit has a second driver circuit configured to couple the I/O pad to the first voltage rail when the transmitter circuit is operated in a second mode. The second driver circuit may be disabled when the transmitter circuit is operated in the first mode. The first driver circuit may be disabled when the transmitter circuit is operated in the second mode. The first voltage rail may deliver power at a first voltage level when the transmitter circuit is operated in the first mode and at a second voltage level when the transmitter circuit is operated in the second mode. The first voltage level may have a magnitude that is greater than magnitude of the second voltage level. The first voltage rail and the second voltage rail may have the same voltage level when the transmitter circuit is operated in the first mode, and different voltage levels when the transmitter circuit is operated in the second mode. In one example, the switch is implemented using a transmission gate. In some implementations, the gating signal is provided by a circuit that is powered by the third voltage rail.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Certain aspects of the disclosure are applicable to input/out (I/O) circuits that provide an interface between core circuits and memory devices. Many mobile devices employ Synchronous Dynamic Random Access Memory (SDRAM), including Low-Power double data rate SDRAM, which may be referred to as low-power DDR SDRAM, LPDDR SDRAM or, in some instances, LPDDRi SDRAM where i describes the technology generation of the LPDDR SDRAM. Examples of LPDDR SDRAM include LPDDR2 SDRAM, LPDDR4 SDRAM and LPDDR4X SDRAM, where LPDDR4X SDRAM may refer to a variant of LPDDR4 SDRAM that provides improved power saving capabilities over LPDDR4 SDRAM. Later generations of LPDDR SDRAM designed to operate at higher operating frequencies may employ lower voltage levels in the core of an SoC or memory device to mitigate for increased power associated with the higher operating frequencies.

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs. The evolution of transistor technology has led to decreased gate oxide thickness and lower operating voltages. Gate oxide thickness may be configured to be a fraction of transistor channel length. In one example, the gate oxide thickness is between 2% and 4% of the length of the transistor channel. As transistor size decreases, the corresponding reduction in gate oxide thickness reduces the maximum gate-drain, operating voltage that can be used with the device.

ICs typically provide multiple voltage domains for power saving purposes. For example, higher voltage domains provide power at higher voltage levels than lower voltage domains. Higher voltage domains are sometimes needed for interfacing with external devices, while core logic circuits can generally operate at the lower voltage levels available in lower voltage domains. For the purposes of this disclosure, a thick-oxide transistor may refer to a transistor that has a gate oxide thickness sufficient to enable the transistor to withstand and operate at the higher voltage levels in higher voltage domains and a thin-oxide transistor may refer to a transistor that has a gate oxide thickness that is insufficient to avoid electrical overstress when the transistor spans a higher voltage level in the higher voltage domains. In certain examples disclosed herein, a thin-oxide transistor may be rated for voltages up to 0.6 volts and a thick-oxide transistor may be rated for voltages greater than 0.6 volts and thick-oxide transistors may be used in a higher a high-voltage domain that provides power at 1.2 volts.

Figure 1:
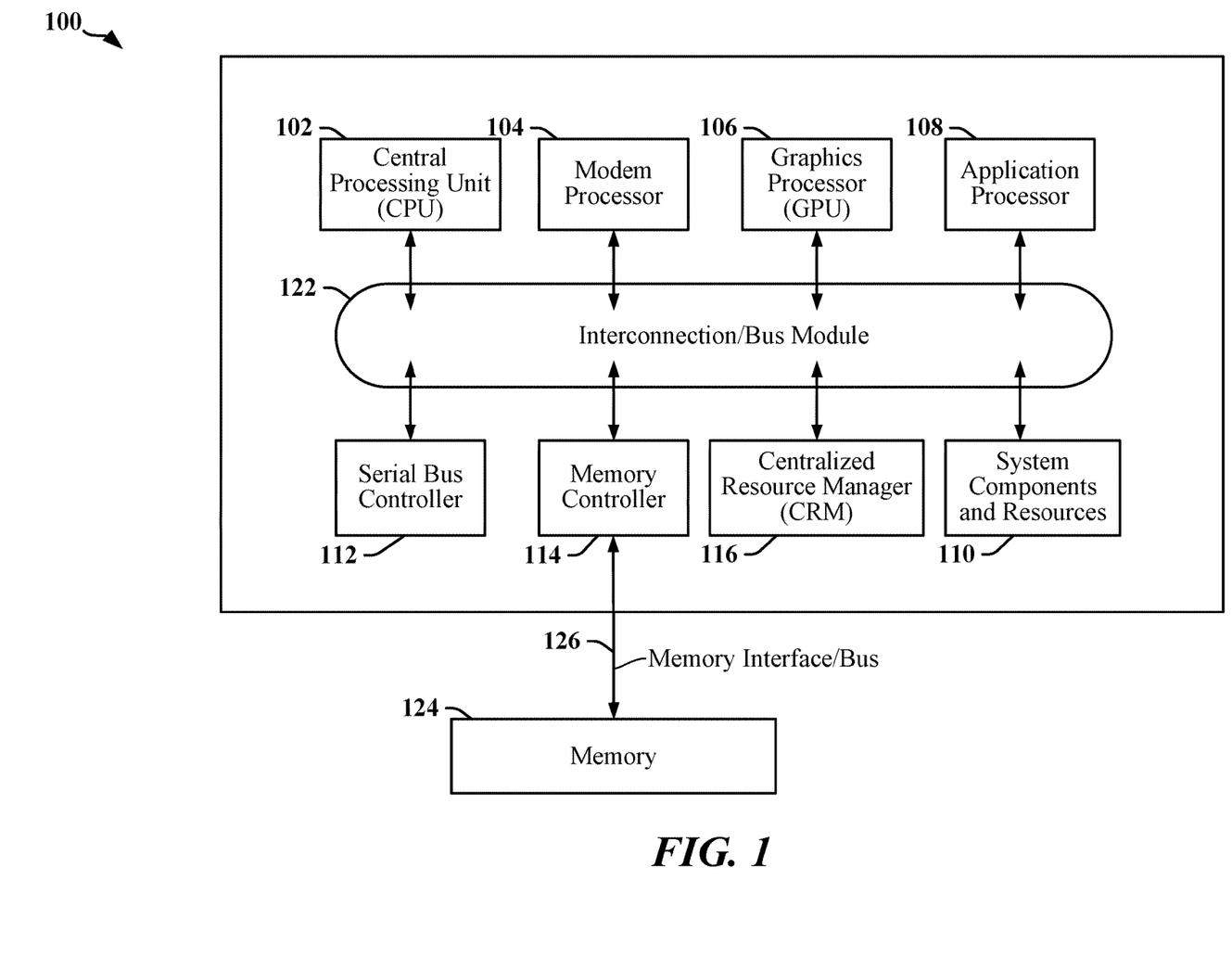
FIG. 1 illustrates example components and interconnections in a system-on-chip (SoC) that may be suitable for implementing certain aspects of the present disclosure.

FIG. 1 illustrates example components and interconnections in a system-on-chip (SoC) 100 that may be suitable for implementing certain aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores. As used herein, a voltage rail refers to the means by which power at a specified voltage is distributed throughout an IC.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) or other serial bus controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high-performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from memory 124 via a memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100. In certain aspects, the memory 124 may conform to specifications governing the manufacture and use of one or more types of LPDDRi SDRAM.

Certain memory devices may be configurable to operate in accordance with specifications defining the operational characteristics of multiple types of LPDDRi SDRAM. In one example, a memory device may be operated in LPDDR2 SDRAM and LPDDR4X SDRAM modes of operation, which may be referred to herein as the "LP2" and "LP4X" modes, respectively. The memory device includes double data rate input/output circuits (DDRIO) that enable the memory device to communicate with corresponding I/O circuits in the SoC 100 or another device coupled to the memory device. The DDRIO may be configurable for multi-mode operation. In some instances, a transmitter in the DDRIO of a memory device that supports LP2 and LP4X modes of operation may include multiple circuits that perform the same function at different voltage levels.

Figure 2:
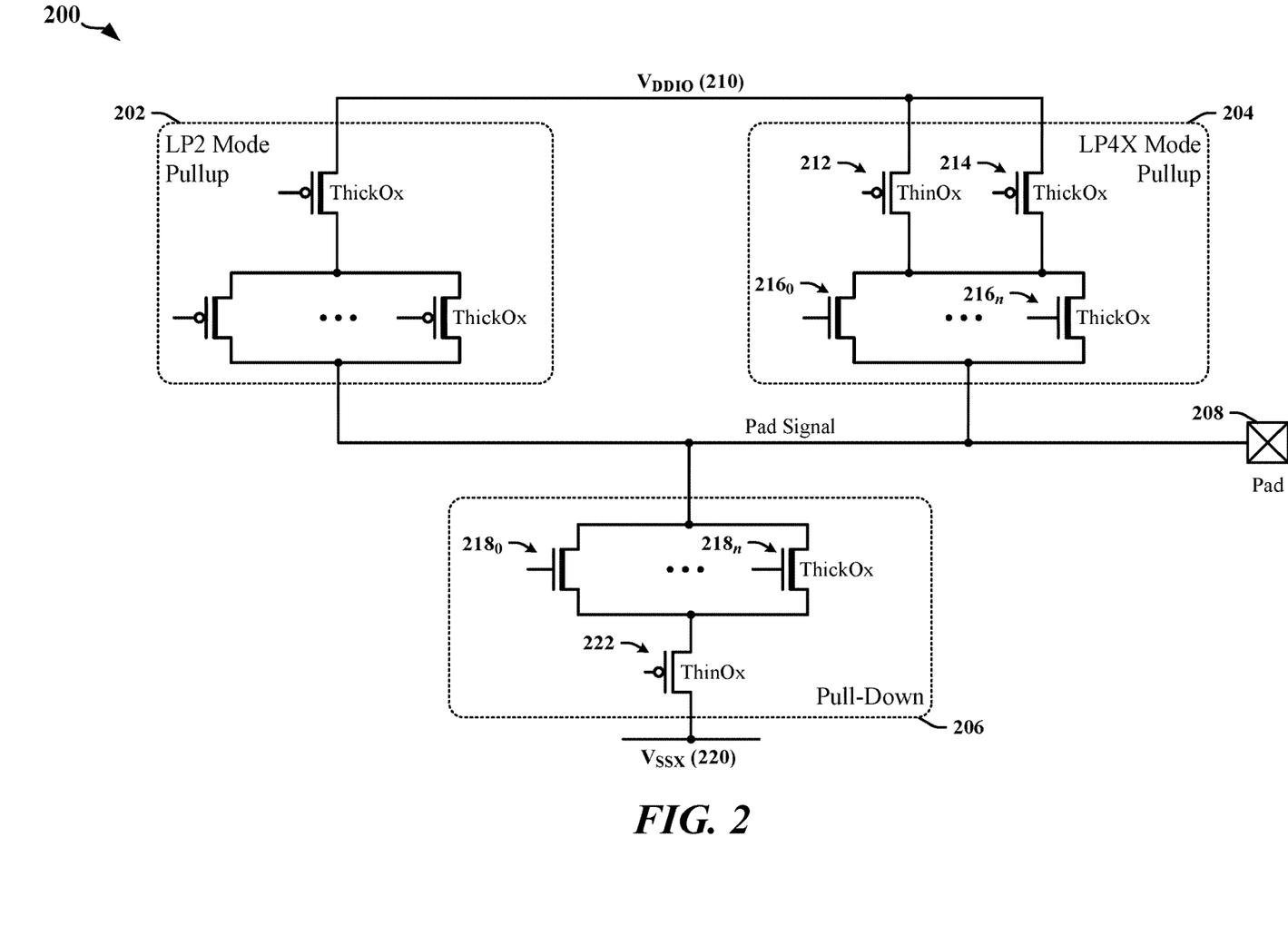
FIG. 2 illustrates an example of a combination transmitter in the input/output circuit of a memory device that can be operated in multiple modes.

FIG. 2 illustrates an example of a transmitter 200 in the DDRIO of a memory device that can be operated in LP2 and LP4X modes. In the illustrated example, the transmitter 200 is coupled to and drives an input/output pad (the I/O pad 208) using multiple driver circuits. As used herein, the term input/output pad relates to a structure that is part of a coupling that conducts signals between internal circuits of the core of an IC device and the external terminals, connectors or pins of a chip package that carries the IC device. In one example, input/output pads may be coupled to external terminals, connectors or pins through wires that are thermosonically bonded to the input/output pads. In another example, input/output pads may be coupled to external terminals, connectors or pins through solder balls that contact the input/output pads. The process technology used to manufacture the memory device that includes the transmitter 200, the signaling scheme and the operating voltages may determine the type of transistor gate oxide used in the transmitter 200.

In the illustrated example, the I/O pad 208 is coupled to an output voltage rail ($V_{DDIO}$ 210) through one driver circuit configured as an LP2 mode pullup circuit 202 or through another driver circuit configured as an LP4X pullup circuit 204. The LP2 mode pullup circuit 202 can be used to drive the I/O pad 208 when the transmitter 200 is configured for the LP2 mode of operation in which $V_{DDIO}$ may provide power at 1.2 Volts. The LP4X pullup circuit 204 can be used to drive the I/O pad 208 when the transmitter 200 is configured for the LP4X mode of operation in which $V_{DDIO}$ may provide power at 0.6 Volts. The illustrated LP2 mode pullup circuit 202 is implemented using only thick-oxide transistors. The illustrated LP4X pullup circuit 204 is implemented using a combination of thin-oxide transistors 212 and thick-oxide transistors 214, $216_0$-$216_n$.

In the illustrated example, the I/O pad 208 is coupled to the lowest voltage rail (i.e., $V_{SSX}$ 220) through yet another driver circuit configured as a pulldown circuit 206 that is used in the LP2 mode and the LP4X mode. The illustrated pulldown circuit 206 is implemented using a combination of thick-oxide transistors $218_0$-$218_n$ and thin-oxide transistors 222. For the purposes of this disclosure, the highest voltage power supply rail in the memory device may be referred to as $V_{DDPX}$, the lowest voltage power supply rail is referred to as $V_{SSX}$.

In order to operate as a combination transmitter that functions in both the LP4x and LP2 modes, the DDRIO transmitter 200 is required to conform to signaling schemes and voltage domains defined by the corresponding specifications and standards. To meet these requirements, the DDRIO transmitter 200 is implemented using a combination of thick-gate and thin-gate devices. The voltage domains in which the transmitter 200 operates include voltage rails that deliver power to various sections of a memory device. For example, $V_{DDIO}$ 210 is shared with SDRAM circuits and provided to the LP2 mode pullup circuit 202 and LP4X pullup circuit 204 (driver circuits) at 1.2 volts in LP2 mode and at 0.6 volts in LP4x mode. Another voltage rail ($V_{DDA}$) is shared across the physical interface (PHY) of the memory device and is used to power pre-driver and logic circuits coupled to the DDRIO transmitter 200. In many examples, the voltage level of $V_{DDA}$ is scalable and may be collapsed to improve power efficiency of the PHY.

Conventional combination transmitters do not support $V_{DDA}$ collapse in which voltage of the $V_{DDA}$ voltage rail is expected to drop to a zero-volt level, which correspond to the voltage level of $V_{SSX}$ in some instances. Some conventional combination transmitters support a "retention mode" in which the voltage level of $V_{DDA}$ is scaled to a lower level or intermediate level voltage. In conventional transmitters, $V_{DDA}$ collapse is typically avoided to prevent electrical overstress (EOS) of thin-oxide transistors in the LP2 mode.

Figure 3:
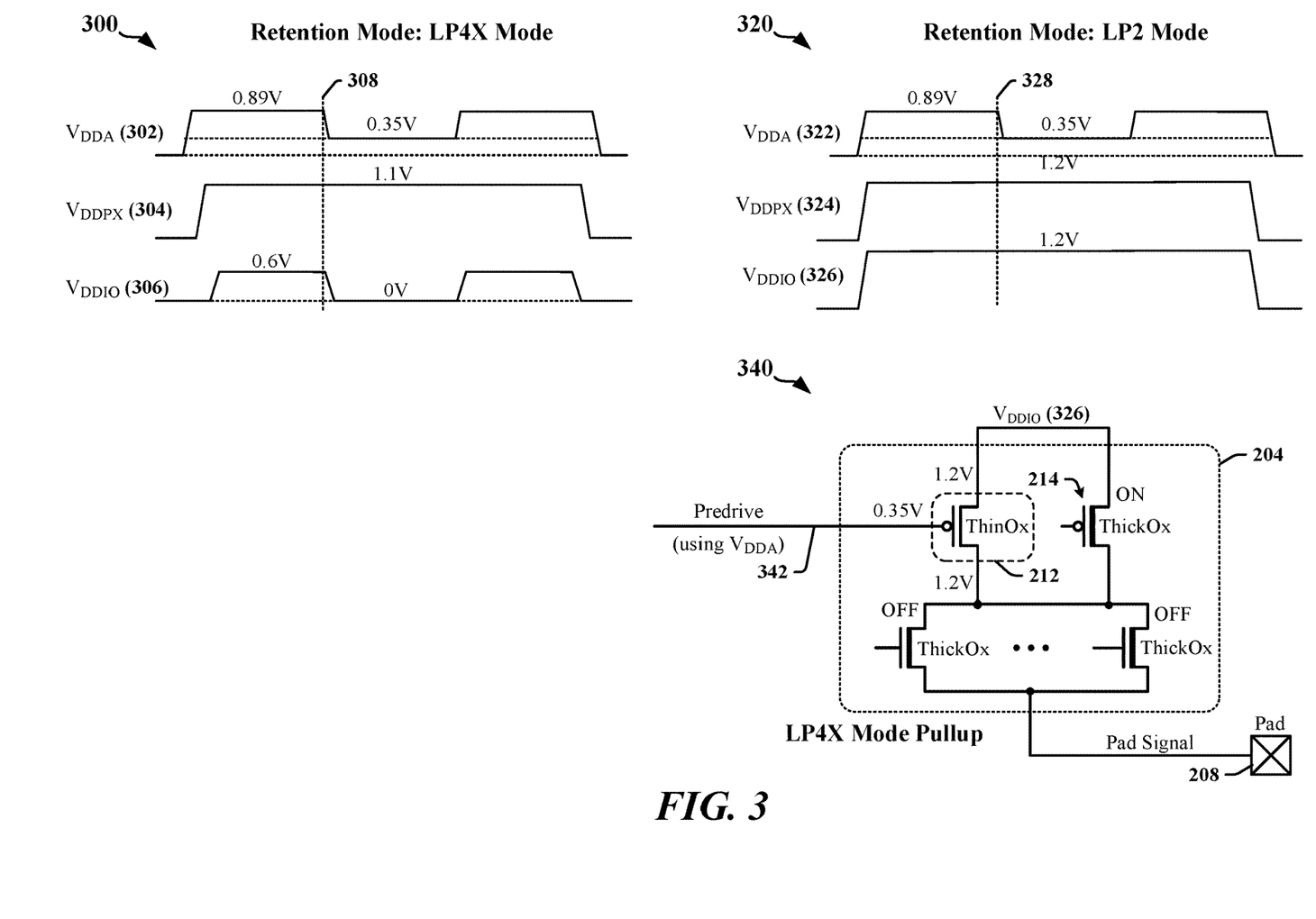
FIG. 3 illustrates certain aspects of retention mode in a combination transmitter that supports multiple modes of operation.

FIG. 3 illustrates certain aspects of retention mode in a combination transmitter that supports LP4X and LP2 modes. The first timing diagram 300 illustrates entry into retention mode when the combination transmitter is operated in the LP4X mode. Entry into retention mode commences at a point in time 308 at which the voltage level of $V_{DDA}$ 302 drops from 0.89 volts to 0.35 volts. The highest voltage power available to the transmitter is provided by $V_{DDPX}$ 304, which remains at a constant voltage level. The voltage level of $V_{DDIO}$ 306 is not tied to the voltage level of $V_{DDPX}$ 304 and drops from 0.6 volts to 0 volts. In the LP4X mode, the maximum voltage across the thin-oxide transistor 212 upon entry into the retention mode is defined by the voltage applied to the gate of the thin-oxide transistor 212, which is driven by pre-driver and logic circuits powered by $V_{DDA}$ 302. In retention mode, the voltage of $V_{DDA}$ 302 is 0.35 volts.

The second timing diagram 320 illustrates entry into retention mode when the combination transmitter is operated in the LP2 mode. Certain retention mode voltages in the LP4X pullup circuit 204 during LP2 mode operation are illustrated in the circuit diagram 340. Entry into retention mode commences at a point in time 328 at which the voltage level of $V_{DDA}$ 322 drops from 0.89 volts to 0.35 volts. The highest voltage power available to the transmitter is provided by $V_{DDPX}$ 324, which remains at a constant voltage level. The voltage level of $V_{DDIO}$ 326 is tied to the voltage level of $V_{DDPX}$ 304 and remains at 1.2 volts. In the LP2 mode, the thin-oxide transistor 212 is inactive and turned off by a signal 342 that is driven to a high signaling state by pre-driver and logic circuits powered by $V_{DDA}$ 322. In retention mode, the voltage of $V_{DDA}$ 322 is 0.35 volts. The maximum voltage across the thin-oxide transistor 212 upon entry into the retention mode may be calculated as 1.2−0.35=0.85 volts, which is less than the maximum voltage level of $V_{DDA}$ 322, and which consequently lies within the maximum operating voltage level defined for the thin-oxide transistor 212.

Figure 4:
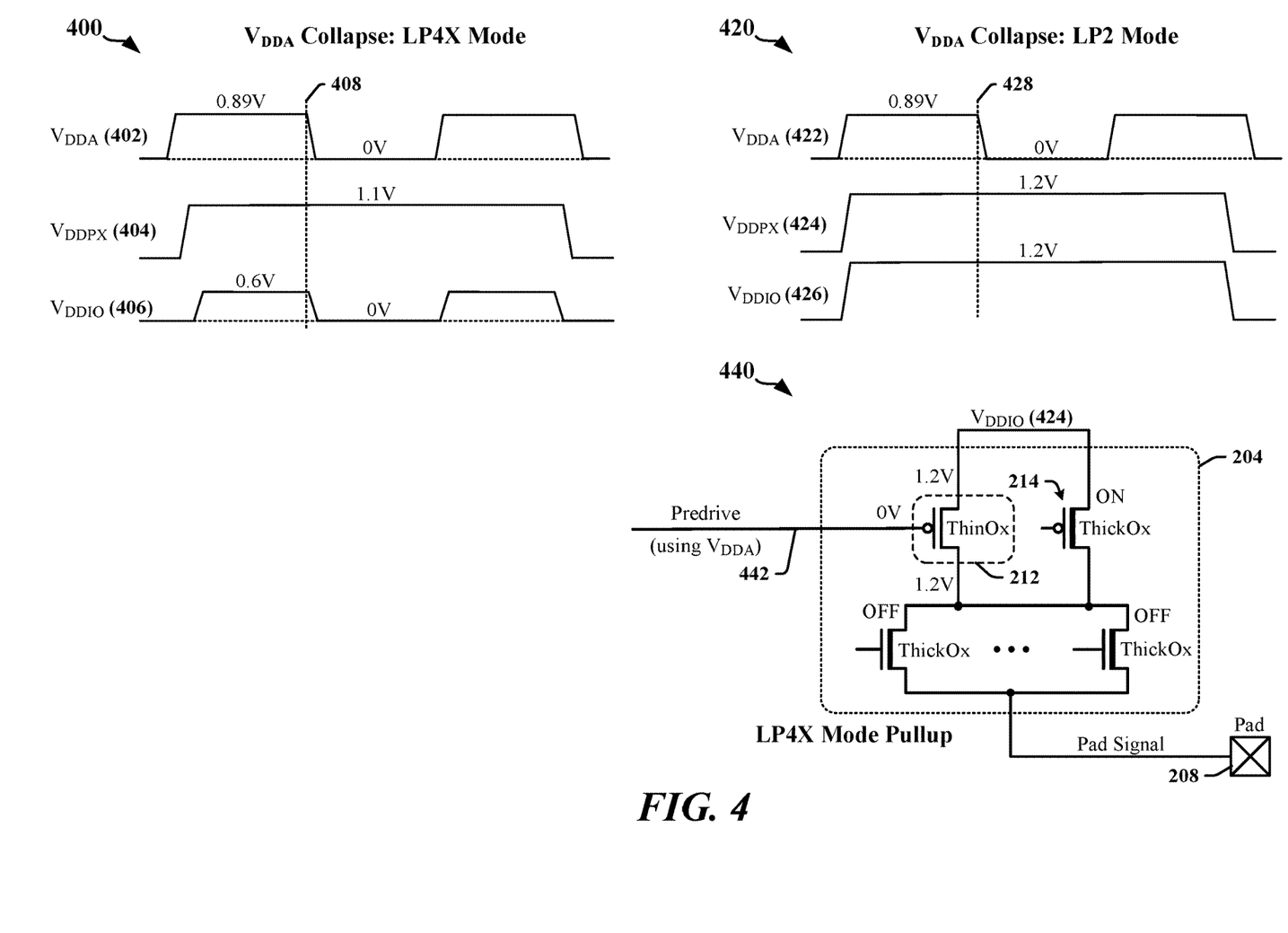
FIG. 4 illustrates certain aspects of voltage collapse in a combination transmitter that supports multiple modes of operation.

FIG. 4 illustrates certain aspects of voltage collapse in a combination transmitter that supports LP4x and LP2 modes. The first timing diagram 400 illustrates entry into voltage collapse when the combination transmitter is operated in the LP4X mode. Entry into voltage collapse commences at a point in time 408 at which the voltage level of $V_{DDA}$ 402 drops from 0.89 volts to 0 volts. The highest voltage power available to the transmitter is provided by $V_{DDPX}$ 404, which remains at a constant voltage level. The voltage level of $V_{DDIO}$ 406 is not tied to the voltage level of $V_{DDPX}$ 404 and drops from 0.6 volts to 0 volts. In the LP4X mode, the maximum voltage across the thin-oxide transistor 212 upon entry into voltage collapse is defined by the voltage applied to the gate of the thin-oxide transistor 212, which is driven by pre-driver and logic circuits powered by $V_{DDA}$ 402. In voltage collapse, the voltage of $V_{DDA}$ 402 is 0 volts.

The second timing diagram 420 illustrates entry into voltage collapse when the combination transmitter is operated in the LP2 mode. Certain voltages in the LP4X pullup circuit 204 during voltage collapse in LP2 mode operation are illustrated in the circuit diagram 440. Voltage collapse commences at a point in time 428 at which the voltage level of $V_{DDA}$ 422 drops from 0.89 volts to 0 volts. The highest voltage power available to the transmitter is provided by $V_{DDPX}$ 424, which remains at a constant 1.2 V voltage level. The voltage level of $V_{DDIO}$ 426 is tied to the voltage level of $V_{DDPX}$ 404 and remains at 1.2 volts. The thin-oxide transistor 212 is controlled by a signal 442 that is received from pre-driver and logic circuits powered by $V_{DDA}$ 422. In the LP2 mode, $V_{DDA}$ 422 is at 0 volts during voltage collapse, the signal 442 received from pre-driver and logic circuits can be expected to be at 0 volts during voltage collapse, and the thin-oxide transistor 212 is then turned on. In the LP4X mode, the maximum voltage across the thin-oxide transistor 212 (gate-drain and/or gate-source voltage) during voltage collapse can be expected to be 1.2 volts and may exceed the maximum operating voltage level defined for the thin-oxide transistor 212, thereby causing EOS.

Certain aspects of this disclosure provide circuits, methods and techniques that enable a combination transmitter to avoid EOS during voltage collapse, including when the combination transmitter is operating in LP2 mode. In one aspect, overall system power efficiency can be improved when the combination transmitter is configured to withstand voltage collapse on $V_{DDA}$ and the entire PHY can enter low-power or idle states.

Figure 5:
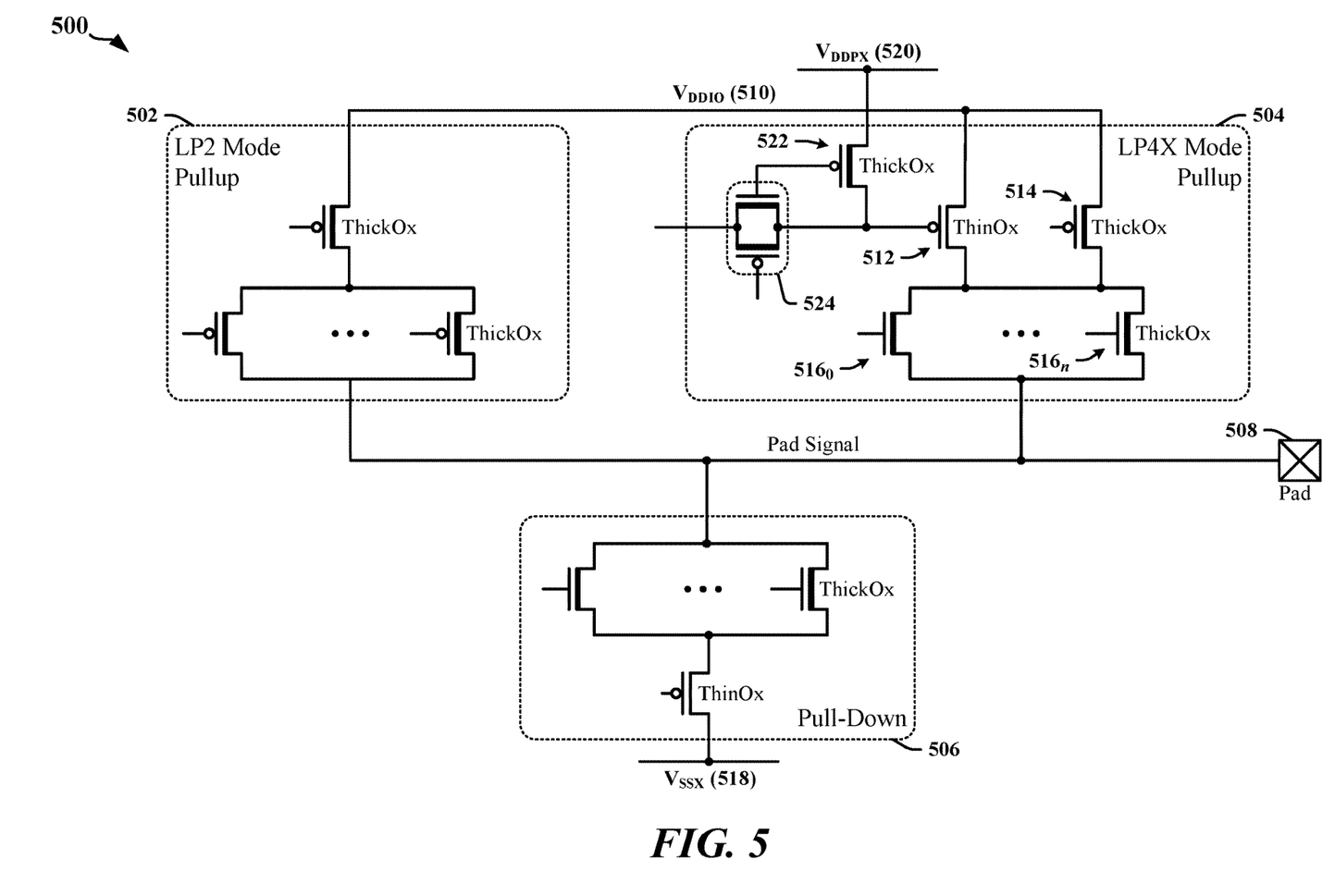
FIG. 5 illustrates an example of a combination transmitter in the input/output circuit of a memory device configured in accordance with certain aspects disclosed herein.

FIG. 5 illustrates an example of a DDRIO transmitter 500 configured in accordance with certain aspects disclosed herein. The DDRIO transmitter 500 includes certain features of the DDRIO transmitter 200 illustrated in FIG. 2 and may be implemented in a memory device that can be operated in LP2 and LP4X modes. The DDRIO transmitter 500 supports voltage collapse in both LP2 mode and LP4X mode.

In the illustrated example, the transmitter 500 is coupled to, and drives an input/output pad (the I/O pad 508) using multiple driver circuits. The I/O pad 508 can be coupled to an output voltage rail ($V_{DDIO}$ 510) through one driver circuit configured as an LP2 mode pullup circuit 502 or through another driver circuit configured as an LP4X pullup circuit 504. In one example, the LP2 mode pullup circuit 502 may be used when the transmitter 500 is configured for the LP2 mode of operation in which $V_{DDIO}$ provides power at 1.2 Volts, and the LP4X pullup circuit 504 may be used when the transmitter 500 is configured for the LP4X mode of operation in which $V_{DDIO}$ provides power at 0.6 Volts. The LP2 mode pullup circuit 502 may be implemented using thick-oxide transistors. In the illustrated example, the LP4X pullup circuit 504 is implemented using a combination of thin-oxide transistors 512 and thick-oxide transistors 514, $516_0$-$516_n$. The process technology used to manufacture the memory device, signaling scheme and voltage domain that includes the transmitter 500 may determine the type of transistor oxide used in the transmitter 500.

In the illustrated example, the I/O pad 508 is coupled to the lowest voltage power supply rail (i.e., $V_{SSX}$ 518) through yet another driver circuit configured as a pulldown circuit 506 regardless of the mode of operation of the transmitter 500. The pulldown circuit 506 may be implemented using thick-oxide transistors.

The DDRIO transmitter 500 can operate as a combination transmitter that functions in both the LP4x and LP2 modes, and the DDRIO transmitter 500 may be configured to operate using different signaling schemes and in different voltage domains in accordance with corresponding or relevant specifications and standards. The DDRIO transmitter 500 may be implemented using a mix of thick-gate and thin-gate device in the pull-up paths. The voltage domains in which the transmitter 500 operates include voltage rails that deliver power to multiple sections of a memory device. For example, $V_{DDIO}$ 510 is shared with SDRAM circuits and provided to the LP2 mode pullup circuit 502 and LP4X pullup circuit 504 (driver circuits) at 1.2 volts in LP2 mode and at 0.6 volts in LP4x mode. Another voltage rail ($V_{DDA}$) is shared across the physical interface (PHY) of the memory device and is used to power pre-driver and logic circuits coupled to the DDRIO transmitter 500. In many examples, the voltage level of $V_{DDA}$ is scalable and may be collapsed to improve power efficiency of the PHY.

The DDRIO transmitter 500 supports voltage collapse in which voltages of certain voltage rails are expected to drop to a zero-volt level, or to the level of $V_{SSX}$. The LP4X pullup circuit 504 includes a thick-oxide, gate-pull transistor 522 that is configured to pull the gate of the thin-oxide transistor 512 to $V_{DDPX}$ 520 when the DDRIO transmitter 500 is operated in LP2 mode. The gate-pull transistor 522 causes the thin-oxide transistor 512 to be turned off in LP2 mode. A pass gate circuit 524 is provided to avoid leakage between $V_{DDPX}$ and $V_{DDA}$ in LP2 mode. The pass gate circuit 524, which may also be referred to as a transmission gate, is disabled when the DDRIO transmitter 500 is operated in LP2 mode and the pass gate circuit 524 remains disabled upon entry into voltage collapse mode.

Figure 6:
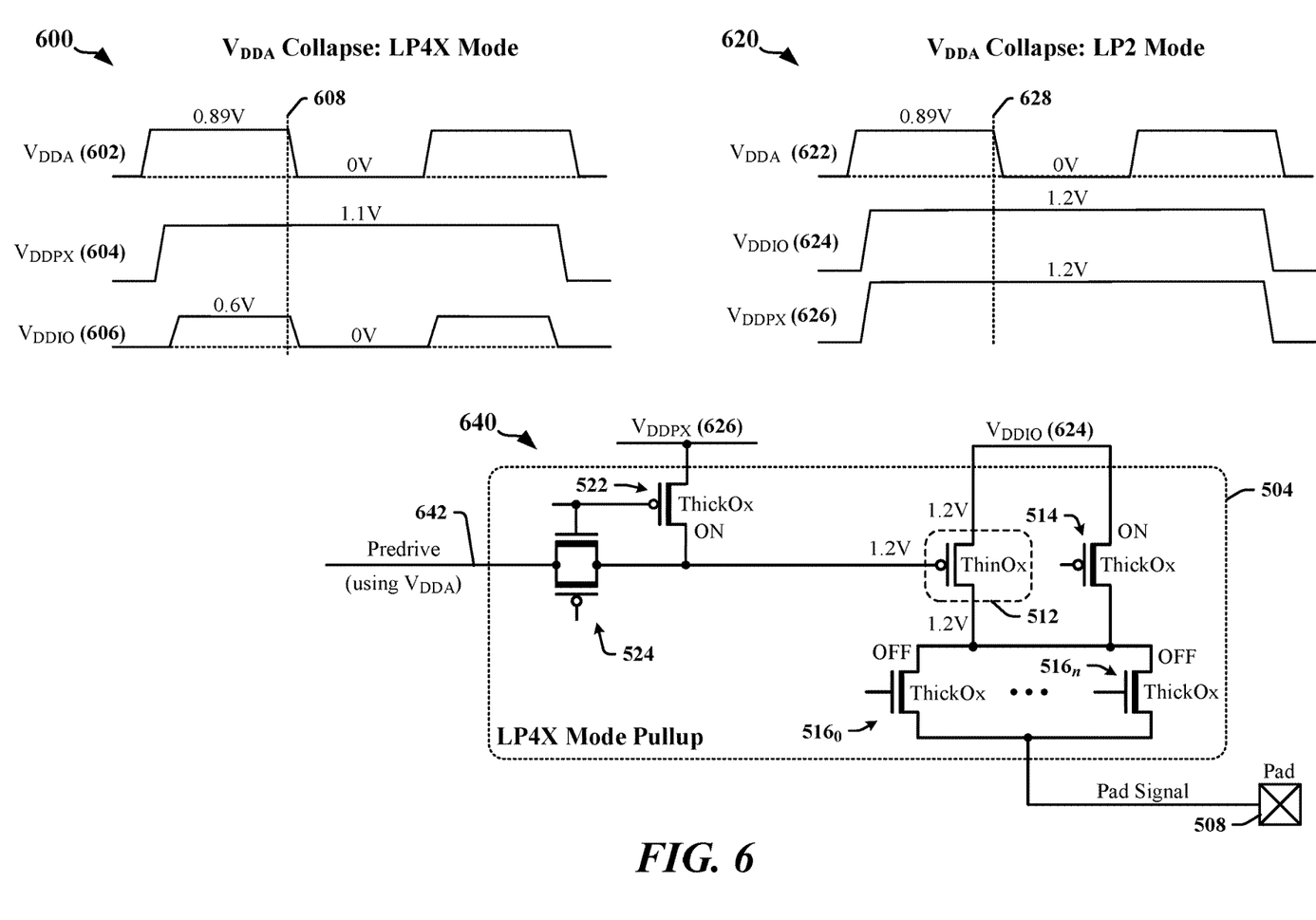
FIG. 6 illustrates certain aspects of voltage collapse in the combination transmitter illustrated in FIG. 5.

FIG. 6 illustrates certain aspects of voltage collapse during LP4x and LP2 modes in the combination transmitter illustrated in FIG. 5. The first timing diagram 600 illustrates entry into voltage collapse when the combination transmitter is operated in the LP4X mode. Entry into voltage collapse commences at a point in time 608 at which the voltage level of $V_{DDA}$ 602 drops from 0.89 volts to 0 volts. The highest voltage power available to the transmitter is provided by $V_{DDPX}$ 604, which remains at a constant voltage level. The voltage level of $V_{DDIO}$ 606 is not tied to the voltage level of $V_{DDPX}$ 604 and drops from 0.6 volts to 0 volts. In the LP4X mode, the maximum voltage across the thin-oxide transistor 512 upon entry into the voltage collapse mode is defined by the voltage applied to the gate of the thin-oxide transistor 512, which is driven by pre-driver and logic circuits powered by $V_{DDA}$ 602. In voltage collapse mode, the voltage of $V_{DDA}$ 602 is 0 volts.

The second timing diagram 620 illustrates entry into voltage collapse when the combination transmitter is operated in the LP2 mode. Certain voltages in the LP4X pullup circuit 504 during voltage collapse in LP2 mode operation are illustrated in the circuit diagram 640. Voltage collapse commences at a point in time 628 at which the voltage level of $V_{DDA}$ 622 drops from 0.89 volts to 0 volts. The highest voltage power available to the transmitter is provided by $V_{DDPX}$ 626, which remains at a constant 1.2 V voltage level. The voltage level of $V_{DDIO}$ 624 is tied to the voltage level of $V_{DDPX}$ 604 and remains at 1.2 volts.

The gate-pull transistor 522 and pass gate circuit 524 operate to avoid EOS that could otherwise affect the thin-oxide transistor 512. In one example, the gate-pull transistor 522 and pass gate circuit 524 are configured to cause all terminals of thin-oxide transistor 512 to be pulled to $V_{DDIO}$ 624 during LP2 mode. In LP2 mode, $V_{DDIO}$ 624 has the same voltage as the $V_{DDPX}$ 626, resulting in no electric potential or a negligible electric potential across the thin-oxide transistor 512. When the pass gate circuit 524 is turned on, the thin-oxide transistor 512 is controlled by a gating signal 642 that is received from pre-driver and logic circuits powered by $V_{DDA}$ 622. In the LP2 mode, the pass gate circuit 524 is turned off and the gating signal 642 is decoupled from the gate of the thin-oxide transistor 512. The voltage on the gate of the thin-oxide transistor 512 is then controlled by the gate-pull transistor 522. The pass gate circuit 524 operates as a switch and can be configured to block transmission of the gating signal 642 to the gate of the thin-oxide transistor 512.

The circuits in FIGS. 5 and 6 are provided as examples for illustrative purposes. Certain combinations of thin-oxide P-type metal-oxide-semiconductor (PMOS) transistors and thick-oxide ide N-type metal-oxide-semiconductor (NMOS) transistors are depicted. It is contemplated that the concepts disclosed herein can be implemented using other combinations of thick-oxide NMOS transistors, thin-oxide NMOS transistors, thin-oxide PMOS transistors and thick-oxide PMOS transistors.

Figure 7:
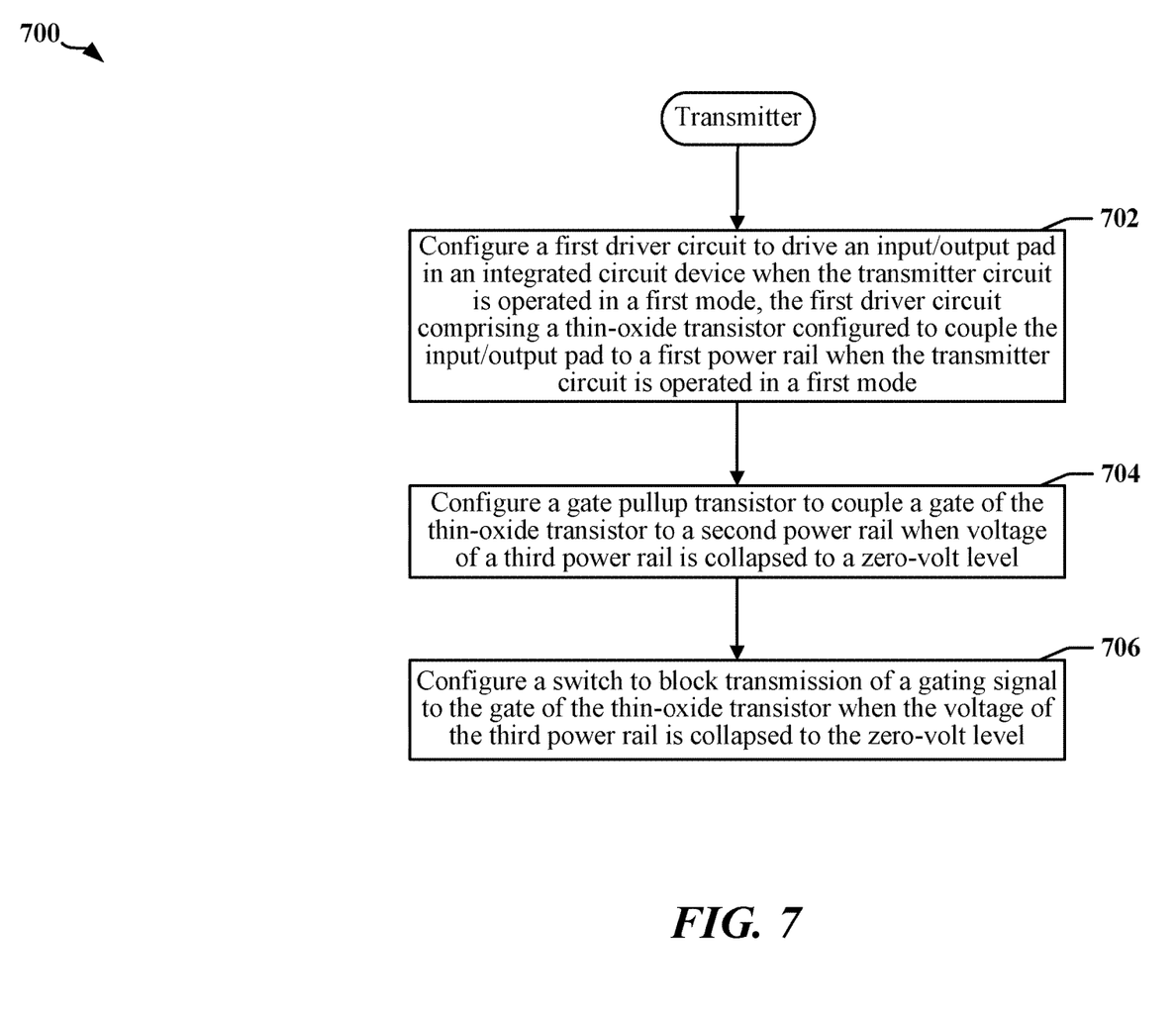
FIG. 7 is a flowchart that illustrates a method for operating a transmitter circuit such as the combination transmitter illustrated in FIG. 5.

FIG. 7 is a flowchart illustrating an example of a method 700 for operating a transmitter circuit in an IC device in accordance with certain aspects disclosed herein. The method may relate to various features and aspects of the driver circuits illustrated in FIGS. 5 and 6. At block 702, a first driver circuit is configured to drive an I/O pad in an IC device when the transmitter circuit is operated in a first mode. The first driver circuit may include a thin-oxide transistor configured to couple the I/O pad to a first voltage rail when the transmitter circuit is operated in a first mode. At block 704, a gate pullup transistor is configured to couple a gate of the thin-oxide transistor to a second voltage rail when voltage of a third voltage rail is collapsed to a zero-volt level. At block 706, a switch is configured to block transmission of a gating signal to the gate of the thin-oxide transistor when the voltage of the third voltage rail is collapsed to the zero-volt level.

In certain examples, a second driver circuit is configured to couple the I/O pad to the first voltage rail when the transmitter circuit is operated in a second mode. The second driver circuit may be disabled when the transmitter circuit is operated in the first mode. The first driver circuit may be disabled when the transmitter circuit is operated in the second mode. The first voltage rail may deliver power at a first voltage level when the transmitter circuit is operated in the first mode and may deliver power at a second voltage level when the transmitter circuit is operated in the second mode. The first voltage level may have a magnitude that is greater than magnitude of the second voltage level. The first voltage rail and the second voltage rail may have a same voltage level when the transmitter circuit is operated in the first mode, and may have different voltage levels when the transmitter circuit is operated in the second mode.

In one example, the switch comprises a transmission gate. In some implementations, the gating signal is provided by a circuit powered by the third voltage rail.

It is noted that the operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering. In certain aspects, an apparatus performing certain functions disclosed herein may include means for driving an I/O pad provided in an IC device. In some examples, the means for driving the I/O pad includes a thin-oxide transistor in a first driver circuit that is active when the transmitter circuit is operated in a first mode and that is configured to couple the I/O pad to the first voltage rail when active. The apparatus may include means for pulling a gate of the thin-oxide transistor to a second voltage rail when voltage of a third voltage rail is collapsed to a zero-volt level, and means for blocking transmission of a gating signal to the gate of the thin-oxide transistor when the voltage of the third voltage rail is collapsed to the zero-volt level.

In certain implementations, the means for driving an I/O pad further includes a second driver circuit that is active when the transmitter circuit is operated in a second mode and that is configured to couple the I/O pad to the first voltage rail when active. The second driver circuit may be disabled when the transmitter circuit is operated in the first mode. The first driver circuit may be disabled when the transmitter circuit is operated in the second mode. The first voltage rail may deliver power at a first voltage level when the transmitter circuit is operated in the first mode and may deliver power at a second voltage level when the transmitter circuit is operated in the second mode. The first voltage level may have a magnitude that is greater than the magnitude of the second voltage level. The first voltage rail and the second voltage rail may have a same voltage level when the transmitter circuit is operated in the first mode and different voltage levels when the transmitter circuit is operated in the second mode.

In some instances, the means for blocking transmission of the gating signal comprises a transmission gate. In some implementations, the gating signal is provided by a circuit powered by the third voltage rail.

In one example, a transmitter circuit provided in accordance with certain aspects of this disclosure has a first driver circuit configured to drive an I/O pad in an integrated circuit device, the first driver circuit including a thin-oxide transistor configured to couple the I/O pad to a first voltage rail when the transmitter circuit is operated in a first mode. The transmitter circuit also has a gate pullup transistor configured to couple a gate of the thin-oxide transistor to a second voltage rail when voltage of a third voltage rail is collapsed to a zero-volt level, and a switch configured to block transmission of a gating signal to the gate of the thin-oxide transistor when the voltage of the third voltage rail is collapsed to the zero-volt level.

In some implementations, the transmitter circuit has a second driver circuit configured to couple the I/O pad to the first voltage rail when the transmitter circuit is operated in a second mode. The second driver circuit may be disabled when the transmitter circuit is operated in the first mode. The first driver circuit may be disabled when the transmitter circuit is operated in the second mode. The first voltage rail may deliver power at a first voltage level when the transmitter circuit is operated in the first mode and at a second voltage level when the transmitter circuit is operated in the second mode. The first voltage level may have a magnitude that is greater than magnitude of the second voltage level. The first voltage rail and the second voltage rail may have the same voltage level when the transmitter circuit is operated in the first mode, and different voltage levels when the transmitter circuit is operated in the second mode. In one example, the switch is implemented using a transmission gate. In some implementations, the gating signal is provided by a circuit that is powered by the third voltage rail.

Some implementation examples are described in the following numbered clauses:

1. A transmitter circuit comprising: a first driver circuit configured to drive an input/output pad in an integrated circuit device, the first driver circuit comprising a thin-oxide transistor configured to couple the input/output pad to a first voltage rail when the transmitter circuit is operated in a first mode; a gate pullup transistor configured to couple a gate of the thin-oxide transistor to a second voltage rail when voltage of a third voltage rail is collapsed to a zero-volt level; and a switch configured to block transmission of a gating signal to the gate of the thin-oxide transistor when the voltage of the third voltage rail is collapsed to the zero-volt level.

2. The transmitter circuit as described in clause 1, further comprising: a second driver circuit configured to couple the input/output pad to the first voltage rail when the transmitter circuit is operated in a second mode.

3. The transmitter circuit as described clause 2, wherein the second driver circuit is disabled when the transmitter circuit is operated in the first mode, and wherein the first driver circuit is disabled when the transmitter circuit is operated in the second mode.

4. The transmitter circuit as described in clause 2 or clause 3, wherein the first voltage rail delivers power at a first voltage level when the transmitter circuit is operated in the first mode, and wherein the first voltage rail delivers power at a second voltage level when the transmitter circuit is operated in the second mode.

5. The transmitter circuit as described in clause 4, wherein the first voltage level has a magnitude that is greater than magnitude of the second voltage level.

6. The transmitter circuit as described in any of clauses 1-5, wherein the first voltage rail and the second voltage rail have a same voltage level when the transmitter circuit is operated in the first mode, and wherein the first voltage rail and the second voltage rail have different voltage levels when the transmitter circuit is operated in the second mode.

7. The transmitter circuit as described in any of clauses 1-6, wherein the switch comprises a transmission gate.

8. The transmitter circuit as described in any of clauses 1-7, wherein the gating signal is provided by a circuit powered by the third voltage rail.

9. An apparatus, comprising: means for driving an input/output pad provided in an integrated circuit device, including a thin-oxide transistor in a first driver circuit that is active when the apparatus is operated in a first mode and that is configured to couple the input/output pad to a first voltage rail when active; means for pulling a gate of the thin-oxide transistor to a second voltage rail when voltage of a third voltage rail is collapsed to a zero-volt level; and means for blocking transmission of a gating signal to the gate of the thin-oxide transistor when the voltage of the third voltage rail is collapsed to the zero-volt level.

10. The apparatus as described in clause 9, wherein the means for driving an input/output pad further includes: a second driver circuit that is active when the apparatus is operated in a second mode and that is configured to couple the input/output pad to the first voltage rail when active.

11. The apparatus as described in clause 10, wherein the second driver circuit is disabled when the apparatus is operated in the first mode, and wherein the first driver circuit is disabled when the apparatus is operated in the second mode.

12. The apparatus as described in clause 10 or clause 11, wherein the first voltage rail delivers power at a first voltage level when the apparatus is operated in the first mode, and wherein the first voltage rail delivers power at a second voltage level when the apparatus is operated in the second mode.

13. The apparatus as described in clause 12, wherein the first voltage level has a magnitude that is greater than magnitude of the second voltage level.

14. The apparatus as described in any of clauses 9-13, wherein the first voltage rail and the second voltage rail have a same voltage level when the apparatus is operated in the first mode, and wherein the first voltage rail and the second voltage rail have different voltage levels when the apparatus is operated in the second mode.

15. The apparatus as described in any of clauses 9-14, wherein the means for blocking transmission of the gating signal comprises a transmission gate.

16. The apparatus as described in any of clauses 9-15, wherein the gating signal is provided by a circuit powered by the third voltage rail.

17. A method for operating a transmitter circuit, comprising: configuring a first driver circuit to drive an input/output pad in an integrated circuit device when the transmitter circuit is operated in a first mode, the first driver circuit comprising a thin-oxide transistor configured to couple the input/output pad to a first voltage rail when the transmitter circuit is operated in a first mode; configuring a gate pullup transistor to couple a gate of the thin-oxide transistor to a second voltage rail when voltage of a third voltage rail is collapsed to a zero-volt level; and configuring a switch to block transmission of a gating signal to the gate of the thin-oxide transistor when the voltage of the third voltage rail is collapsed to the zero-volt level.

18. The method as described in clause 17, further comprising: configuring a second driver circuit to couple the input/output pad to the first voltage rail when the transmitter circuit is operated in a second mode.

19. The method as described in clause 18, wherein the second driver circuit is disabled when the transmitter circuit is operated in the first mode, and wherein the first driver circuit is disabled when the transmitter circuit is operated in the second mode.

20. The method as described in clause 18 or clause 19, wherein the first voltage rail delivers power at a first voltage level when the transmitter circuit is operated in the first mode, and wherein the first voltage rail delivers power at a second voltage level when the transmitter circuit is operated in the second mode.

21. The method as described in clause 20, wherein the first voltage level has a magnitude that is greater than magnitude of the second voltage level.

22. The method as described in any of clauses 17-21, wherein the first voltage rail and the second voltage rail have a same voltage level when the transmitter circuit is operated in the first mode, and wherein the first voltage rail and the second voltage rail have different voltage levels when the transmitter circuit is operated in the second mode.

23. The method as described in any of clauses 17-22, wherein the switch comprises a transmission gate.

24. The method as described in any of clauses 17-23, wherein the gating signal is provided by a circuit powered by the third voltage rail.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A transmitter circuit comprising:
a first driver circuit configured to drive an input/output pad in an integrated circuit device, the first driver circuit comprising a thin-oxide transistor configured to couple the input/output pad to a first voltage rail when the transmitter circuit is operated in a first mode;
a thick-oxide gate pullup transistor configured to couple a gate of the thin-oxide transistor to a second voltage rail when the transmitter circuit is operated in a second mode, the second voltage rail supplying power at a voltage level of greater magnitude than the voltage at which the first voltage rail supplies power; and
a switch that is turned on when the transmitter circuit is operated in the first mode and turned off when the transmitter circuit is operated in the second mode, the switch being configured to block transmission of a gating signal to the gate of the thin-oxide transistor when the switch is turned off,
wherein the gating signal is provided by a circuit powered by a third voltage rail, the first voltage rail supplying power at a voltage level of greater magnitude than the voltage at which the third voltage rail supplies power.

2. The transmitter circuit of claim 1, further comprising:
a second driver circuit configured to couple the input/output pad to the first voltage rail when the transmitter circuit is operated in the second mode.

3. The transmitter circuit of claim 2, wherein the second driver circuit is disabled when the transmitter circuit is operated in the first mode, and wherein the first driver circuit is disabled when the transmitter circuit is operated in the second mode.

4. The transmitter circuit of claim 2, wherein the first voltage rail delivers power at a first voltage level when the transmitter circuit is operated in the first mode, and wherein the first voltage rail delivers power at a second voltage level when the transmitter circuit is operated in the second mode.

5. The transmitter circuit of claim 4, wherein the first voltage rail and the second voltage rail supply power at voltage levels that are greater than 0.6 Volts and wherein the third voltage rail supplies power at a voltage level that is less than 0.6 Volts.

6. A transmitter circuit comprising:
a first driver circuit configured to drive an input/output pad in an integrated circuit device, the first driver circuit comprising a thin-oxide transistor configured to couple the input/output pad to a first voltage rail when the transmitter circuit is operated in a first mode;
a second driver circuit configured to couple the input/output pad to the first voltage rail when the transmitter circuit is operated in a second mode;
a gate pullup transistor configured to couple a gate of the thin-oxide transistor to a second voltage rail when voltage of a third voltage rail is collapsed to a zero-volt level; and
a switch configured to block transmission of a gating signal to the gate of the thin-oxide transistor when the voltage of the third voltage rail is collapsed to the zero-volt level,
wherein the first voltage rail and the second voltage rail have a same voltage level when the transmitter circuit is operated in the first mode, and wherein the first voltage rail and the second voltage rail have different voltage levels when the transmitter circuit is operated in the second mode.

7. The transmitter circuit of claim 1, wherein the switch comprises a transmission gate coupled to an output of a pre-driver or logic circuit powered by the third voltage rail.

8. The transmitter circuit of claim 1, wherein the thin-oxide transistor is rated for voltages up to 0.6 Volts and wherein the thick-oxide transistor is rated for voltages greater than 0.6 Volts.

9. An apparatus, comprising:
means for driving an input/output pad provided in an integrated circuit device, including a thin-oxide transistor in a first driver circuit that is active when the apparatus is operated in a first mode and that is configured to couple the input/output pad to a first voltage rail when active;
means for pulling a gate of the thin-oxide transistor to a second voltage rail when the apparatus is operated in a second mode, the second voltage rail supplying power at a voltage level of greater magnitude than the voltage at which the first voltage rail supplies power; and
means for blocking transmission of a gating signal to the gate of the thin-oxide transistor when the apparatus is operated in the second mode, wherein the gating signal is provided by a circuit powered by a third voltage rail, the first voltage rail supplying power at a voltage level of greater magnitude than the voltage at which the third voltage rail supplies power.

10. The apparatus of claim 9, wherein the means for driving an input/output pad further includes:
a second driver circuit that is active when the apparatus is operated in the second mode and that is configured to couple the input/output pad to the first voltage rail when active.

11. The apparatus of claim 10, wherein the second driver circuit is disabled when the apparatus is operated in the first mode, and wherein the first driver circuit is disabled when the apparatus is operated in the second mode.

12. The apparatus of claim 10, wherein the first voltage rail delivers power at a first voltage level when the apparatus is operated in the first mode, and wherein the first voltage rail delivers power at a second voltage level when the apparatus is operated in the second mode.

13. The apparatus of claim 12, wherein the first voltage rail and the second voltage rail supply power at voltage levels that are greater than 0.6 Volts and wherein the third voltage rail supplies power at a voltage level that is less than 0.6 Volts.

14. An apparatus, comprising:
means for driving an input/output pad provided in an integrated circuit device, including a thin-oxide transistor in a first driver circuit that is active when the apparatus is operated in a first mode and that is configured to couple the input/output pad to a first voltage rail when active, and further including a second driver circuit that is active when the apparatus is operated in a second mode and that is configured to couple the input/output pad to the first voltage rail when active;
means for pulling a gate of the thin-oxide transistor to a second voltage rail when voltage of a third voltage rail is collapsed to a zero-volt level; and
means for blocking transmission of a gating signal to the gate of the thin-oxide transistor when the voltage of the third voltage rail is collapsed to the zero-volt level,
wherein the first voltage rail and the second voltage rail have a same voltage level when the apparatus is operated in the first mode, and wherein the first voltage rail and the second voltage rail have different voltage levels when the apparatus is operated in the second mode.

15. The apparatus of claim 9, wherein the means for blocking transmission of the gating signal comprises a transmission gate coupled to an output of a pre-driver or logic circuit powered by the third voltage rail.

16. The apparatus of claim 9, wherein the means for pulling the gate of the thin-oxide transistor to a second voltage rail the third voltage rail comprises a thick-oxide transistor that is rated for voltages greater than 0.6 Volts, and wherein the thin-oxide transistor is rated for voltages up to 0.6 Volts.

17. A method for operating a transmitter circuit, comprising:
configuring a first driver circuit to drive an input/output pad in an integrated circuit device when the transmitter circuit is operated in a first mode, the first driver circuit comprising a thin-oxide transistor configured to couple the input/output pad to a first voltage rail when the transmitter circuit is operated in a first mode;
configuring a thick-oxide gate pullup transistor to couple a gate of the thin-oxide transistor to a second voltage rail when the transmitter circuit is operated in a second mode, the second voltage rail supplying power at a voltage level of greater magnitude than the voltage at which the first voltage rail supplies power;

turning on a switch when the transmitter circuit is operated in the first mode, wherein a gating signal is provided to the gate of the thin-oxide transistor when the switch is turned on; and turning off the switch when the transmitter circuit is operated in the second mode, wherein the gating signal is blocked from the gate of the thin-oxide transistor when the switch is turned off, wherein the gating signal is provided by a circuit powered by a third voltage rail, the first voltage rail supplying power at a voltage level of greater magnitude than the voltage at which the third voltage rail supplies power.

18. The method of claim 17, further comprising:

configuring a second driver circuit to couple the input/output pad to the first voltage rail when the transmitter circuit is operated in the second mode.

19. The method of claim 18, wherein the second driver circuit is disabled when the transmitter circuit is operated in the first mode, and wherein the first driver circuit is disabled when the transmitter circuit is operated in the second mode.

20. The method of claim 18, wherein the first voltage rail delivers power at a first voltage level when the transmitter circuit is operated in the first mode, and wherein the first voltage rail delivers power at a second voltage level when the transmitter circuit is operated in the second mode.

21. The method of claim 20, wherein the first voltage rail and the second voltage rail supply power at voltage levels that are greater than 0.6 Volts and wherein the third voltage rail supplies power at a voltage level that is less than 0.6 Volts.

22. A method for operating a transmitter circuit, comprising:

configuring a first driver circuit to drive an input/output pad in an integrated circuit device when the transmitter circuit is operated in a first mode, the first driver circuit comprising a thin-oxide transistor configured to couple the input/output pad to a first voltage rail when the transmitter circuit is operated in a first mode;

configuring a second driver circuit to couple the input/output pad to the first voltage rail when the transmitter circuit is operated in a second mode;

configuring a gate pullup transistor to couple a gate of the thin-oxide transistor to a second voltage rail when voltage of a third voltage rail is collapsed to a zero-volt level; and configuring a switch to block transmission of a gating signal to the gate of the thin-oxide transistor when the voltage of the third voltage rail is collapsed to the zero-volt level, wherein the first voltage rail and the second voltage rail have a same voltage level when the transmitter circuit is operated in the first mode, and wherein the first voltage rail and the second voltage rail have different voltage levels when the transmitter circuit is operated in the second mode.

23. The method of claim 17, wherein the switch comprises a transmission gate coupled to an output of a pre-driver or logic circuit powered by the third voltage rail.

24. The method of claim 17, wherein the thin-oxide transistor is rated for voltages up to 0.6 Volts and wherein the thick-oxide transistor is rated for voltages greater than 0.6 Volts.

* * * * *